Jan. 5, 1960 O. S. MEIXELL 2,920,230

AMPLIFIER SYSTEM

Filed Nov. 3, 1955

INVENTOR
OLIVER S. MEIXELL
BY Alfred C. Hill
AGENT

United States Patent Office 2,920,230

Patented Jan. 5, 1960

2,920,230

AMPLIFIER SYSTEM

Oliver S. Meixell, Caldwell, N.J., assignor to International Telephone and Telegraph Corporation, Nutley, N.J., a corporation of Maryland Application November 3, 1955, Serial No. 544,689

7 Claims. (Cl. 315—22)

Figure 1:
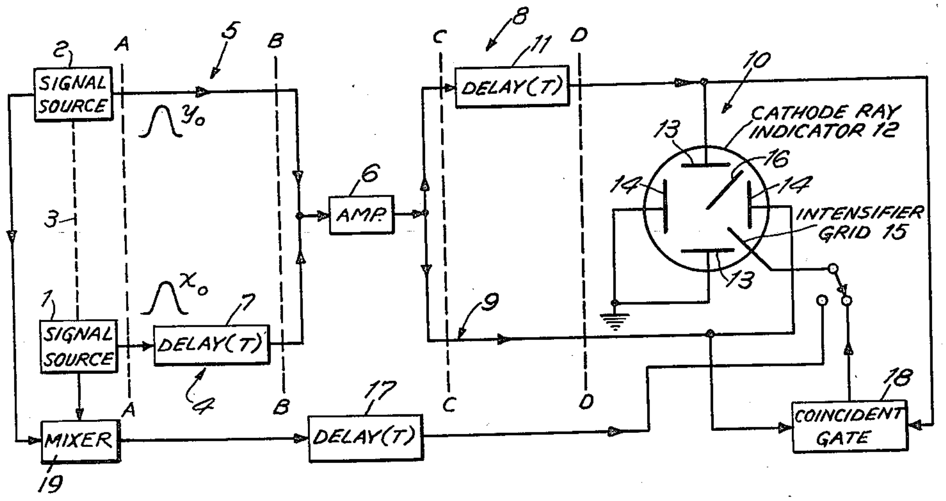

This invention is related to amplifier systems and more particularly to an improved means for independently amplifying two separate trains of time coincident pulses in identical fashion.

For a number of applications employing pulse techniques, such as in electronic reconnaissance equipment, time difference position fixing equipment, Loran equipment and various test equipments, it is necessary to independently amplify two separate trains of time coincident pulses in identical fashion. Frequently this is done by two amplifiers whose characteristics are as nearly alike as possible. Ideally, the amplitude-versus-frequency characteristic should be linear and identical or at least follow an identical functional variation. This is true likewise of the phase-versus-frequency characteristic. Furthermore, the output signal level should be a linear function of the input signal level. However, amplifiers are active networks and, as such, involve vacuum tubes, transistors, and so forth whose characteristic are linear, or follow identical functional variations, over only limited ranges. Painstaking circuit design and careful pairing of tubes or transistors may result in two closely-matched amplifiers. However, subsequent aging or replacement of tubes or transistors necessitate rematching of the above-mentioned characteristics.

Therefore, an object of this invention is to provide a means for independently amplifying two separate trains of time coincident pulses in identical fashion which eliminates the above-mentioned painstaking circuit design and matching of two characteristics.

A feature of this invention is the provision of a single amplifier stage and circuitry associated therewith to independently amplify two separate trains of time coincident pulses in identical fashion.

Another feature of this invention is the provision of an amplifier system for amplifying independently and identically first and second signal pulses which are coincident in time and on two separate channels comprising a means to delay said first signal pulse with respect to said second signal pulse in one of said channels, and an amplifier common to each of said channels for amplification of said first and second pulses. Parallel paths are coupled in common to the output of this amplifier and delay means having a time delay equal to said given time is coupled in one of the parallel paths to delay by said given time said amplified first and second pulses with respect to the amplified first and second pulses on the other of said parallel paths to establish time coincidence between certain of said first and second amplified pulses on said parallel paths. A normally inoperative utilization device is coupled to the parallel output paths of the amplifier and means coupled to at least one point in said system and responsive to the presence of a pulse at each such point for producing a control signal having a predetermined time relationship to said first and second signal pulses and applying said control signal to said utilization device to render said utilization device operative upon application thereto of coincident amplified pulses from said parallel paths.

Figure 2:
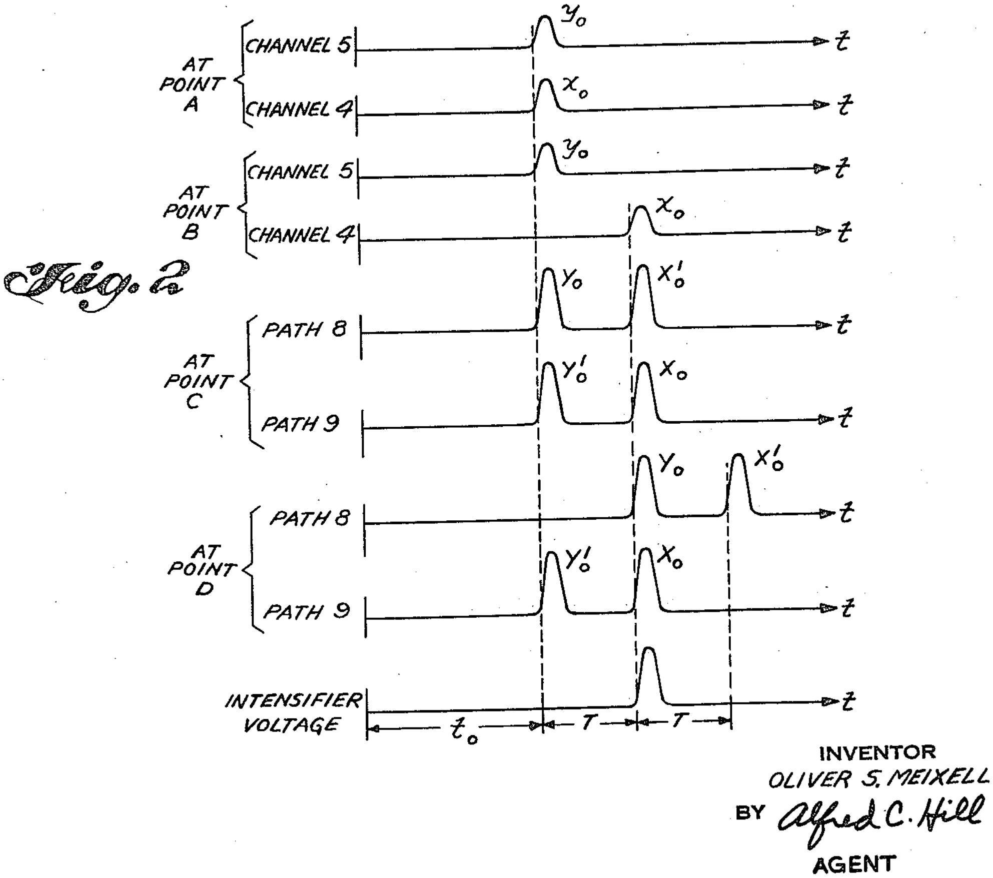

The above-mentioned and other features and objects of this invention will become more apparent by reference to the following description taken in conjunction with the accompanying drawings, in which:

Fig. 1 is a schematic diagram in block form of an amplifier system illustrating the principles of this invention; and Fig. 2 illustrates the signal-versus-time function of two time coincident pulses traced from the input to the output of the system of Fig. 1.

Referring to Fig. 1, there is illustrated therein an amplifier system in accordance with the principles of this invention wherein, for the purposes of illustration, it will be assumed that the amplifier system is employed in an arrangement wherein it is necessary to obtain the display of time coincident pulses on a cathode-ray tube used as a ratio indicator of the amplitudes of the two time coincident pulses.

The time coincident pulses $x_0$ and $y_0$ are supplied from sources 1 and 2, respectively. This may include a mechanical or electronic means 3 interconnecting these two sources to assure time coincidence of the outputs therefrom. The two signal sources may be derived from complex system equipment preceding the amplifying system of this invention. A signal input to the amplifying ssytem from the complex system may be two separate trains of time coincident pulses which, of course, does not preclude the application of separate trains of pulses thereto which can be made time coincident by a prior time delay or advance of one train with respect to the other. In other complex systems, it may be desirable to amplify and obtain the magnitude ratio of two D.C. voltages. This may be accomplished by converting each D.C. voltage into time coincident pulses by mechanical or electronic chopping. The proposed amplifier system for this application would include a matched pair of delay lines to accommodate longer pulses. It is further conceivable that two audio voltages, cophasal but of different amplitudes, could be similarly amplified and compared, or otherwise utilized, after conversion into ultrasonic pulses.

The amplifying system of Fig. 1 includes a first signal channel 4 and a second signal channel 5 having coupled thereto time coincident pulses $x_0$ and $y_0$. The two time coincident pulses at point A of Fig. 1 are illustrated in Fig. 2. It will be assumed, for purposes of illustration, that the two input pulses have equal amplitudes, but it should be remembered that they may have any values relative or absolute which are within the dynamic range capabilities of the amplifier 6.

The channels 4 and 5 are coupled in common to the input of amplifier 6 with the pulse on channel 4 being delayed a given time T by delay line 7. This relative delay at point B between the two channel signals is illustrated in the signal-versus-time function for point B in Fig. 2.

The relatively delayed channel signals are amplified by amplifier 6 and presented at the output thereof to parallel paths 8 and 9. As illustrated by the signal-versus-time function for point C, Fig. 2, each path includes the amplified signals presented to the input of amplifier 6. It will be observed that in the present organization of the amplifier circuit the amplifier primary pulses $Y_0$ and $X_0$ appear in the appropriate paths for utilization in the utilization device 10. It should be further observed that $X_0'$ (equal to $X_0$) appears in path 8 along with, and delayed from, by said given time delay T, the undelayed $Y_0$ pulse and that the $Y_0'$ (equal to $Y_0$) appears in path 9 followed by the delayed $X_0$ pulse. These primed pulses in this instant example serve no useful purpose and will be eliminated by succeeding circuitry. In passing to point D of the amplifying circuit, the amplified pulses of path 9 experience no delay. However, the amplified pulses of path 8 are each delayed by the given time interval T in delay line 11. This is illustrated in the signal-versus-time function for point D in Fig. 2. It will be observed that the delay encountered in path 8 brings the desired components $X_0$ and $Y_0$ in juxtaposition in the time domain.

The amplified pulses on paths 8 and 9 are coupled to utilization device 10 for selection therein of the desired pulse components on each of the paths and for the desired utlization of the selected pulses. For the example therein employed, utilization device 10 includes a cathode-ray indicator 12 having vertical deflection electrodes 13 and horizontal deflection electrodes 14. Cathode-ray indicator 12 is biased to cutoff so that no display will appear on the face thereof until intensified by application of a desired voltage or control signal to intensifier grid 15. The cathode-ray indicator 12, as mentioned hereinabove, is used to obtain a radial line indication of the relative amplitudes of the input signals $x_0$ and $y_0$.

The output of path 8 is coupled to the vertical deflection electrodes 13 while the outputs of the path 9 are coupled to the horizontal deflection electrodes 14. At the time of time coincidence between the $Y_0$ pulse of path 8 and the $X_0$ pulse of path 9, a voltage in time coincidence therewith is applied to intensifier grid 15 for intensification of cathode-ray indicator 12 which displays the $X_0$ and $Y_0$ pulses as a single radial line 16 illustrated in the drawing of Fig. 1 as occurring at an angle of 45° with the horizontal. The angle of the radial line display will vary in accordance with the relative amplitudes of the two pulses compared, the 45° display being accomplished when the two pulses are of equal amplitude.

Grid 15 is intensified by a means coupled to at least one point in the system, such as to at least one of channels 4 or 5 or to the output of paths 8 and 9, which is responsive to a pulse at each such point for producing a control signal having a predetermined time relationship to the first and second signal pulses to assure the utilization of the correct components of the amplified pulses on the paths 8 and 9. One means of obtaining the control signal for intensification is to couple a signal from sources 1 or 2 through delay line 17 or from both sources 1 and 2 via a mixer 19 through a delay line 17 to the intensifier grid 15. Delay line 17 has a delay time equal to T to provide a control signal having the desired time relationship with the first and second signal pulses. As illustrated in the intensifier voltage curve of Fig. 2, this delay line having time delay T will place the control signal in time coincidence with the desired $Y_0$ and $X_0$ pulses, respectively, on paths 8 and 9. Another means of obtaining the control signal for intensification of indicator 12 is to employ a coincident gate device 18 having coupled thereto the outputs of path 8 and path 9. Gate 18 will produce an output voltage or control signal of sufficient magnitude for intensification of indicator 12 only when coincidence between the $Y_0$ and $X_0$ pulses of the paths 8 and 9 occurs. It will be noted from the curves at point D in Fig. 2 that this occurs at a time T spaced from the first and second signal pulses of sources 1 and 2. This time delay is accomplished by the cooperative action of delay lines 7 and 11. Should only one signal $Y_0$ or $X_0$ be present, the coincident gate would not function. Where this one signal limitation may occur, it is necessary to employ the mixer 19 as a triggering source for grid 15. It should, of course, be recognized that a similar expedient can be employed to separate the desired from the undesired pulses occurring on the two paths 8 and 9 when other types of display, or other uses of the pulses, are contemplated.

It should be noted that the present amplifier system comprises one active network and two passive structures. These replace the two active networks in the prior art amplification systems. The use of but one amplifier, amplifier 6, in the time sharing arrangement assures identical amplification of pulses for both input channels over a wide dynamic range. Thus, there is no longer the burden of matching two active and relatively complex networks. It is necessary only to synchronize two simple passive structures. Once matching of these passive structures is achieved, the system has stability and permanency of characteristics of a passive network. Aging no longer is a problem nor is the replacement of tubes or transistors. The matched condition would not be disturbed if the whole common amplifier were to be replaced by another of comparable characteristics. It is worthy of note that, if automatic gain control is required, it is much less difficult to apply an automatic gain control to a one-amplifier system.

It should be further noted that the delay lines 7 and 8 need not be positioned as indicated in Fig. 1, but any combination of location may be employed limited only by the requirements of the resultant use of the signals applied to the common amplifier 6.

The delay time of the delay devices 7 and 8 can approach a lower limit of about twice the pulse duration of the longest expected pulse. This sets an upper limit of pulse repetition frequency at approximately:

$$f_{max.}=\frac{10^6}{2T}$$

where $f_{max.}$ is expressed in cycles per second and T is the delay time expressed in microseconds. Thus, a system using two 10 microsecond delay lines could accommodate pulses up to 5 microseconds wide and pulse repetition frequencies up to 50,000 per second. The delay lines can be either the distributed parameter type or the lumped parameter type. Whichever type is chosen, the two lines employed should be nearly as identical as possible. Equal time delays T are of paramount importance. However, it is also necessary that other characteristics including bandwidth, attenuation, characteristic impedance, etc. are nearly alike so as to minimize difference in pulse shape and amplitude.

While I have described above the principles of my invention in connection with specific apparatus, it is to be clearly understood that this description is made only by way of example and not as a limitation to the scope of my invention as set forth in the objects thereof and in the accompanying claims.

I claim:

1. An amplifier system for amplifying independently and identically first and second signal pulses which are coincident in time and on two separate channels comprising a delay device having a given time delay coupled in one of the channels to space by said given time said first signal pulses with respect to said second signal pulses, an amplifier, means coupling said channels in common to the input of said amplifier for amplification of said first and second pulses, parallel paths coupled in common to the output of said amplifier, a delay device having a time delay equal to said given time coupled in one of said parallel paths to delay by said given time the amplified first and second pulses thereon with respect to the amplified first and second pulses on the other of said parallel paths to establish time coincidence between certain of said first and second amplified pulses on said parallel paths, a normally inoperative utilization device, means coupling said parallel paths to said utilization device, and means coupled to at least one point in said system and responsive to the presence of a pulse at each such point for producing a control signal having a predetermined time relationship to said first and second signal pulses and applying said control signal to said utilization device to render said utilization device operative upon application thereto of coincident amplified pulses from said parallel paths.

2. A system according to claim 1, wherein said control signal producing means includes a delay device having a delay time equal to said given time coupling said first signal pulse to said utilization device.

3. A system according to claim 1, wherein said control signal producing means includes a mixer to which said two channels are coupled, and a delay device having a delay time equal to said given time coupling the output of said mixer to said utilization device.

4. A system according to claim 1, wherein said control signal producing means includes a coincident gate circuit means coupling the outputs of said parallel paths to said gate circuit to produce an output voltage therefrom upon occurrence of said coincident amplified pulses and means coupling said output voltage to said utilization device for operation thereof.

5. A system according to claim 1, wherein said utilization device includes a cathode-ray indicator biased to cutoff having horizontal deflection electrodes, vertical deflection electrodes, and an intensifier grid and means coupling said horizontal and vertical deflection electrodes respectively to first and second paths of said parallel paths and said control signal producing means includes a mixer to which said two channels are coupled and a delay device having a delay time equal to said given time coupling the output of said mixer to said intensifier grid to overcome the cutoff bias of said cathode-ray indicator for a resultant radial display indicative of the relative amplitudes of said coincidence amplified pulses.

6. A system according to claim 1, wherein said utilization device includes a cathode-ray indicator biased to cutoff having horizontal deflection electrodes, vertical deflection electrodes, and an intensifier grid and means coupling said horizontal and vertical deflection electrodes respectively to first and second paths of said parallel paths and said control signal producing means includes a delay device having a delay time equal to said given time coupling pulse energy from said two channels to said intensifier grid to overcome the cutoff bias of said cathode-ray indicator for a resultant radial display indicative of the relative amplitudes of said coincidence amplified pulses.

7. A system according to claim 1, wherein said utilization device includes a cathode-ray indicator biased to cutoff having horizontal deflection electrodes, vertical deflection electrodes, and an intensifier grid and means coupling said horizontal and vertical deflection electrodes respectively to first and second paths of said parallel paths and said control signal producing means includes a coincident gate circuit, means coupling the outputs of said parallel paths to said gate circuit to produce an output voltage therefrom upon occurrence of said coincidence pulses and means coupling said output voltage to said intensifier grid to overcome the cutoff bias of said cathode-ray indicator for a resultant radial display indicative of the relative amplitudes of said coincident amplified pulses.

References Cited in the file of this patent

UNITED STATES PATENTS

| | | |
|---|---|---|
| 2,089,639 | Bedford | Aug. 10, 1937 |
| 2,570,207 | Chatterjea et al. | Oct. 9, 1951 |
| 2,706,810 | Jacobsen | Apr. 19, 1955 |